United States Patent [19]

Eggert et al.

[11] 4,111,328
[45] Sep. 5, 1978

[54] PREFABRICATED HOUSING FOR ELECTRICAL COMPONENTS

[75] Inventors: Hans Joachim Eggert, Karlsfeld; Otto Oberberger, Gilching; Heinrich Zenkert; Rudi Kühne, both of Munich, all of Germany

[73] Assignee: Siemens Aktiengesellschaft, Berlin & Munich, Germany

[21] Appl. No.: 684,080

[22] Filed: May 7, 1976

[30] Foreign Application Priority Data

May 26, 1975 [DE] Fed. Rep. of Germany ....... 2523292

[51] Int. Cl.² ........................ B65D 7/00; H02G 3/08; B65D 7/42
[52] U.S. Cl. .................................. 220/4 R; 220/3.94; 220/72
[58] Field of Search ............. 220/4 R, 4 A, 4 B, 4 C, 220/4 F, 3.94, 72

[56] References Cited

U.S. PATENT DOCUMENTS

| 3,316,460 | 4/1967 | Scoville | 220/4 F X |
| 3,450,293 | 6/1969 | Seda et al. | 220/4 F |
| 3,482,895 | 12/1969 | Becklin | 220/4 R X |
| 3,563,578 | 2/1971 | Meller | 220/4 F |
| 3,872,995 | 3/1975 | Eickhorst | 220/4 R |
| 4,000,827 | 1/1977 | Emery | 220/4 F |

OTHER PUBLICATIONS

EDN Packaging Ideas, 6/63, Convenient Extrusions Provide Versatile Packaging, pp. 86, 87.

Primary Examiner—William Price
Assistant Examiner—Steven M. Pollard
Attorney, Agent, or Firm—Hill, Gross, Simpson, Van Santen, Steadman, Chiara & Simpson

[57] ABSTRACT

A housing comprises a generally box-like structure having two end pieces and two elongate members joined thereto. The elongate members each have stiffening ribs or cavities and comprise at least one section cut from an extruded bar of indefinite length, thereby affording the advantage that housings of any desired size can be produced from profiled bars of infinite length.

1 Claim, 3 Drawing Figures

U.S. Patent  Sept. 5, 1978  4,111,328
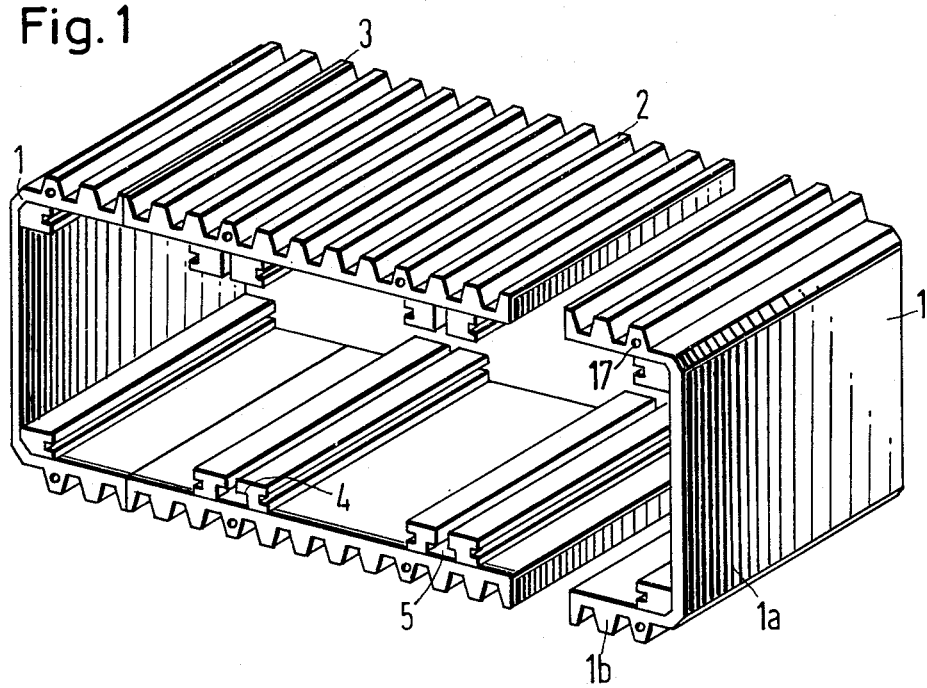
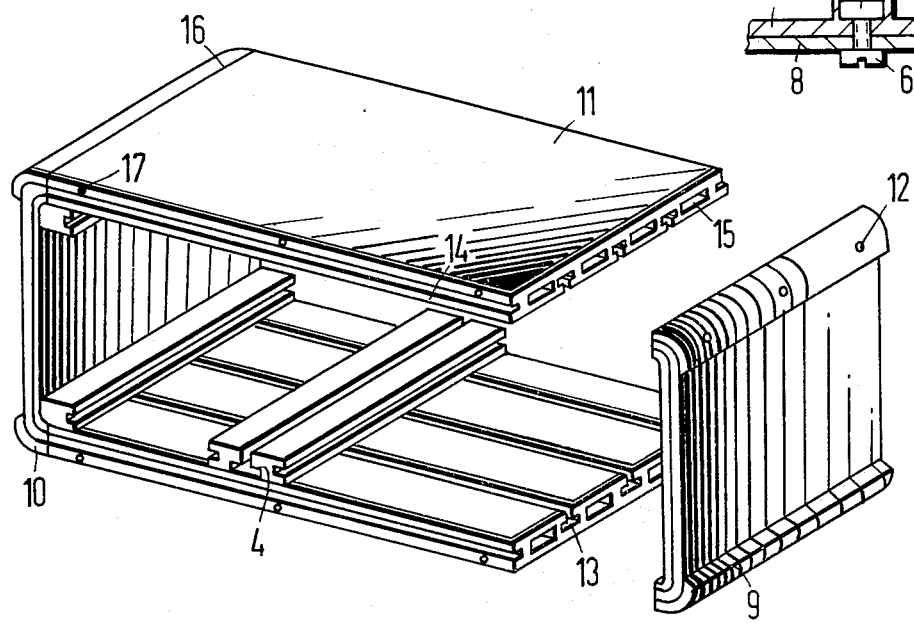

PREFABRICATED HOUSING FOR ELECTRICAL COMPONENTS

BACKGROUND OF THE INVENTION

1. Field of the Invention

The present invention relates to housings for electrical equipment, in particular for electrical equipment such as that used in communications and measurement operations, wherein the housing is manufactured from prefabricated components.

2. The Prior Art

Generally box-shaped frames closed at two sides by front and rear walls respectively and attached to the frame in a sealed relationship are known from German patent application Nos. P 24 15 051 (corresponding U.S. Pat. No. 4,002,955) and P 24 43 102.

Housings are also known (for example from German DI-AS No. 1 591 521) which comprise frames having no sheet metal cladding and comprising essentially standard profiled bars which are attached together as by means of screws. By using identical profiled sections, in particular extruded profiled sections, for the frame, a certain degree of standardization in construction can be obtained, i.e. housings of different sizes (frame sizes) can be obtained, using standard units.

SUMMARY OF THE INVENTION

An object of the present invention is to provide an improved housing with supporting frame and the major part of the housing, whose dimensions will vary from one housing size to another, constructed using standard components.

Accordingly, the invention consists in a housing comprising a generally box-like structure with two end pieces and two elongate members, the elongate members sealingly joined to the end pieces and extending substantially parallel to one another. Each of the elongate members has stiffening ribs or cavities therein and comprises at least one section cut from an extruded bar of indefinite length. The sections from which the elongate members are made may be joined together longitudinally by adhesive, by soldering, or by like joining methods, so that housing of all sizes can be manufactured by selection of the appropriate number of profiled sections. Thus, virtually any size of housing can be obtained while the internal component structures can be readily mounted and effectively cooled. The housing walls are attached together to provide an electrical and electromagnetic screen and a seal against water. The walls also can be cut to correspond with the requisite housing size, in particular in terms of the depth dimension thereof.

An advantageous further development of the invention is one in which the extruded profiled elements extend in the direction of the depth or the width of the housing, and the joints run in the direction of the housing depth.

Other advantages of the invention reside in that the end walls exhibit extensions which form part of the respective elongate members; and that the elements of the housing walls contain T-groove formations in which fixing screws for additional rails or component assemblies can slide and be clamped in position.

BRIEF DESCRIPTION OF THE DRAWINGS

FIG. 1 is a perspective view of a housing, partially exploded, constructed in accordance with the invention.

FIG. 2 is an end cross-sectional view through an attachment rail and component assembly wall.

FIG. 3 is a perspective view of a second embodiment of the housing, similar to FIG. 1.

DESCRIPTION OF THE PREFERRED EMBODIMENTS

FIG. 1 shows a frame housing for telecommunications and measuring equipment applications, consisting of end walls, 1, 1 and elongate members 2. Each end wall 1 comprises a side wall 1a and two extensions 1b which extend generally at right angles to the side wall. In the assembled state of the housing, the extensions 1b form part of a respective elongate top or bottom member 2. The side wall 1 has smooth surfaces, while each extension 1b has a plurality of raised outer rib portions thereon. These raised portions stiffen the housing and dissipate heat generated within the housing. The end walls 1 may also be provided with such raised portions.

Each elongate member 2 comprises at least one extruded, profiled section cut from an extruded profiled bar to a desired length. The elongate members also have raised rib portions for stiffening and cooling purposes. A joint 3 is formed between the respective elongate members and end walls by soldering, welding, or clamping; in any event the joint screens against electromagnetic fields and also seals against the penetration of water and steam.

Inside the housing, rails 4 secure individual components such as plug-in units and their contact arrangements. Each rail 4 is provided with a T-section groove 5, shown in detail in FIG. 2. The T-section groove 5 accommodates a nut 7, which is slideable longitudinally in the groove and is cooperable with a screw 6. The screw 6 in turn secures a sheet metal component such as the base wall of a component assembly 8 which, after the screw has been tightened, is secured against displacement in the housing.

FIG. 3 shows a second embodiment of a housing according to the invention. In this embodiment, end walls 9 and 10 comprise extruded elements. The elongate members 11 also comprise extruded profiles having a plurality of cavities 15. The cavities 15 not only economize on material and therefore lighten the housing, but also serve to stiffen it.

T-section grooves 13 are provided at top and bottom of the housing, which accommodate screw fasteners as shown in FIG. 2. The screws enable rails 4 which extend depthwise of the housing to be adjusted sideways in the housing and to be secured in position. Component assemblies can also be attached directly to those T-section grooves 13 without the rails 4.

The housing sections are attached, as indicated at the right and left sides in the exploded view of FIG. 3, in a joint 16 using screws 12 or by welding. The same result can also, of course, be achieved by using a sealing adhesive or by brazing, etc. Conveniently, all the extruded elements are manufactured from aluminum alloys.

Because the front and rear of box-shaped housings of this kind must be connectable to the frame sections to electrically screen and otherwise seal the housing, an electrically screening sealing cord is placed between a fascia plate (not shown in FIG. 1) and the front face of the housing. The same sealing device is also provided for the back wall. Threaded holes 17 are provided for attaching the front and back walls.

In FIG. 3, each of the front and back walls also possess a peripheral projecting rim or lip 14 which serves as an electrical screen. Such design is particularly suitable for housings of the kind disclosed in the German patent application Nos. P 24 15 051 (corresponding to U.S. Pat. No. 4,002,955) and P 24 43 102 already referred to, in which advantageous embodiments of the housing covers and cover seals are shown. It is also convenient to manufacture these housing covers from extruded profiled elements in the manner described earlier, these being made up of interconnected angle elements and substantially straight extruded profiled elements.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A housing construction for electrical components comprising
   (A) two spaced, opposed, flattened side wall members;
   (B) two spaced, opposed, flattened end wall members;
   (C) each one of said side wall and end wall members being an extruded profile comprised of an aluminum alloy;
   (D) each one of said side wall members being further characterized by having integrally defined therein a plurality of spaced, parallel channel members which extend through and thereacross, and also a plurality of spaced, parallel T-grooves which extend thereacross, said T-grooves being in spaced, parallel alternating relationship with said rib members and being defined in a common face thereof;
   (E) each one of said end wall members being further characterized by having transversely extending across each one of a pair of opposed edge portions thereof, a surface portion which terminates along a common face thereof and which is also defined to make a mating and abutting engagement with one of a pair of opposed end edge portions of each one of said side wall members;
   (F) wall joining means mounting said side wall members in such engagement with said end wall members and which screens the resulting joints against electromagnetic fields and also seals said resulting joints against penetration of water and water vapor;
   (G) said T-grooves being adapted to receive therein slidably nut means of bolt and nut assembly means; and
   (H) said channel members being adapted to stiffen said housing construction and to dissipate heat generated therewithin.

* * * * *